(12) United States Patent
Kim et al.

(10) Patent No.: US 8,565,027 B2
(45) Date of Patent: Oct. 22, 2013

(54) MULTI-CHIP PACKAGE AND OPERATING METHOD THEREOF

(75) Inventors: Bum Dol Kim, Gyeonggi-do (KR); You Sung Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/310,236

(22) Filed: Dec. 2, 2011

(65) Prior Publication Data

US 2012/0140579 A1 Jun. 7, 2012

(30) Foreign Application Priority Data

Dec. 3, 2010 (KR) .......................... 10-2010-0122904

(51) Int. Cl.
*G11C 7/06* (2006.01)
(52) U.S. Cl.
USPC .......................... 365/189.07; 365/51; 365/226
(58) Field of Classification Search
USPC ................................. 365/189.07, 51, 226, 52
See application file for complete search history.

(56) References Cited

U.S. PATENT DOCUMENTS

| 5,546,589 | A | * | 8/1996 | Odaira | 713/340 |
| 5,943,257 | A | * | 8/1999 | Jeon et al. | 365/145 |
| 7,859,322 | B2 | * | 12/2010 | Takeuchi | 327/538 |
| 7,957,217 | B2 | * | 6/2011 | Park et al. | 365/230.03 |

FOREIGN PATENT DOCUMENTS

| KR | 1019970051148 | 7/1997 |
| KR | 1020070038675 | 4/2007 |
| KR | 1020080079496 | 9/2008 |

OTHER PUBLICATIONS

Notice of Allowance issued from the Korean Intellectual Property Office on May 21, 2012.

* cited by examiner

*Primary Examiner* — Huan Hoang
(74) *Attorney, Agent, or Firm* — IP & T Group LLP

(57) ABSTRACT

A multi-chip package includes a voltage generating circuit configured to generate a power source voltage and a plurality of memory chips coupled to the voltage generating circuit to each receive the power source voltage, wherein the memory chips are each configured to postpone an operation if the power source voltage is lower than a target voltage and perform the operation when the power source voltage reaches the target voltage.

16 Claims, 6 Drawing Sheets

MULTI-CHIP PACKAGE AND OPERATING METHOD THEREOF

CROSS-REFERENCE TO RELATED APPLICATION

Priority to Korean patent application number 10-2010-0122904 filed on Dec. 3, 2010, the entire disclosure of which is incorporated by reference herein, is claimed.

BACKGROUND

Exemplary embodiments relate to a multi-chip package and, more particularly, to a multi-chip package capable of reducing a peak current.

In order to increase the degree of integration and performance of memory chips, stacked memory chips are being developed. That is, 2, 4, or 8 memory chips are stacked in order to increase the degree of integration as compared with a single memory chip.

In general, in a multi-chip package of a plurality of memory chips, the memory chips share a dedicated power supplied to the package.

If the plurality of memory chips perform operations that consume a large current, at the same time, such as bit line precharge operations, a peak current is large since currents overlap each other in time.

In order to address such a feature, a current consumption period may be extended so as to reduce the peak current. In this case, however, the time taken to perform a program operation and the time taken to perform a read operation are increased regardless of a voltage drop.

BRIEF SUMMARY

According to exemplary embodiments, a situation where a large amount of current flows is detected based on a power source voltage prior to an operation of consuming a large amount of current, and the operation is halted based on the detected power source voltage. Accordingly, a peak current of the entire multi-chip package can be reduced.

A multi-chip package according to an aspect of this disclosure includes a voltage generating circuit configured to generate a power source voltage and a plurality of memory chips coupled to the voltage generating circuit to each receive the power source voltage, wherein the memory chips are each configured to postpone an operation if the power source voltage is lower than a target voltage and perform the operation when the power source voltage reaches the target voltage.

A multi-chip package according to another aspect of this disclosure includes a voltage generating circuit configured to generate a power source voltage, a voltage detecting circuit configured to compare the power source voltage with a target voltage and generate a sense signal if, as a result of the comparison, the power source voltage is lower than the target voltage, and a plurality of memory chips configured to each receive the power source voltage and maintain a standby mode when the sense signal is received.

A multi-chip package according to yet another aspect of this disclosure includes a voltage generating circuit configured to generate a power source voltage, a plurality of memory chip groups each comprising memory chips operated by the power source voltage, and voltage detecting circuits corresponding to the plurality of memory chip groups, respectively, wherein the voltage detecting circuits are each configured to compare the power source voltage with a target voltage and to output a sense signal to the memory chips of the memory chip group if, as a result of the comparison, the power source voltage is lower than the target voltage. The memory chips of the memory chip group may each maintain a standby mode when the sense signal is received.

An operating method of a multi-chip package according to an aspect of this disclosure includes supplying a power source voltage to a plurality of memory chips, checking the power source voltage before an operation is performed by a memory chip of the memory chips, maintaining the memory chip in a standby mode if, as a result of the check, the power source voltage is lower than a target voltage, and allowing the memory chip to perform the operation if, as a result of the check, the power source voltage has reached the target voltage.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
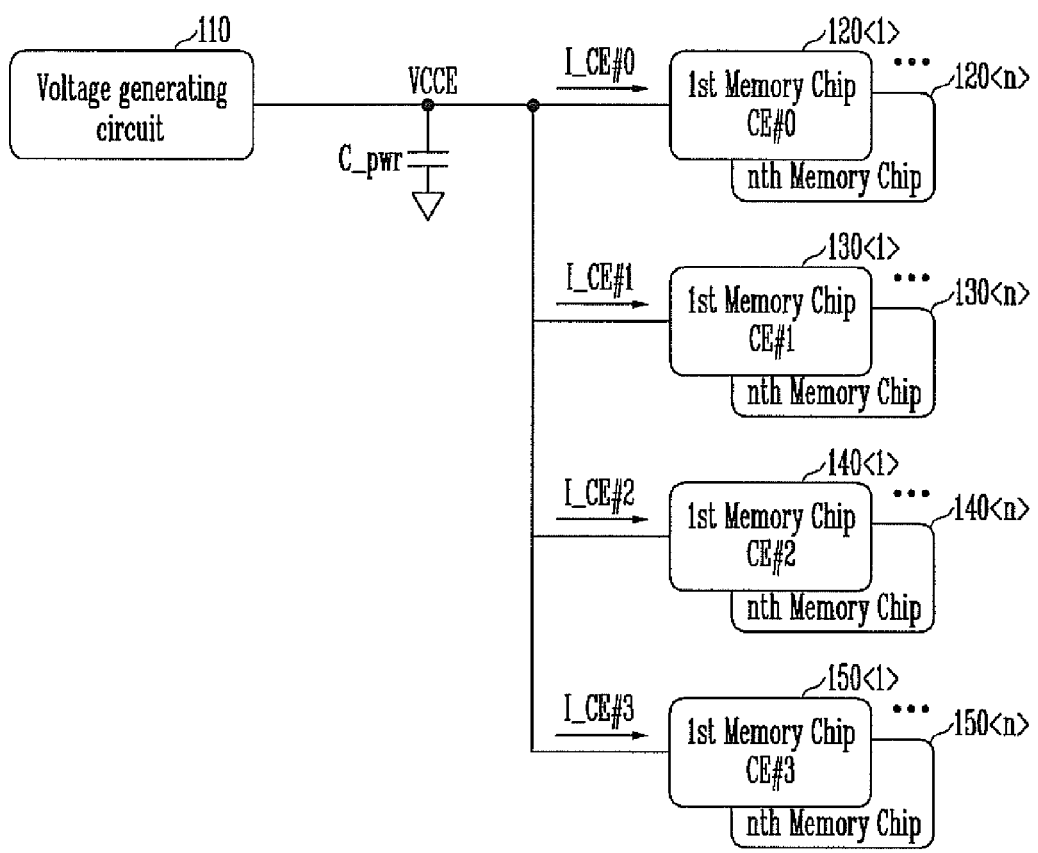
FIG. 1 is a block diagram illustrating a multi-chip package according to a first embodiment of this disclosure.

FIG. 1 is a block diagram illustrating a multi-chip package according to a first embodiment of this disclosure.

Referring to FIG. 1, the multi-chip package according to the embodiment of this disclosure includes a voltage generating circuit 110 and a plurality of memory chips 120<1> to 120<n> to 150<1> to 150<n>.

More particularly, the first to $n^{th}$ memory chips 120<1> to 120<n> sharing a $0^{th}$ chip enable signal CE#0, the first to $n^{th}$ memory chips 130<1> to 130<n> sharing a first chip enable signal CE#1, the first to $n^{th}$ memory chips 140<1> to 140<n> sharing a second chip enable signal CE#2, and the first to $n^{th}$ memory chips 150<1> to 150<n> sharing a third chip enable signal CE#3 are coupled in parallel.

External power source voltage VCCE from the voltage generating circuit 110 is supplied to the memory chips 120<1> to 120<n> to 150<1> to 150<n>. Accordingly, current I_CE#0 to I_CE#3 flowing through the memory chips sharing one chip enable signal (that is, current consumed by the memory chips) is determined. The consumption current is varied according to the operation performed by each memory chip. The operations performed by the memory chips include an operation incurring high current consumption and an operation incurring low current consumption.

Figure 2:
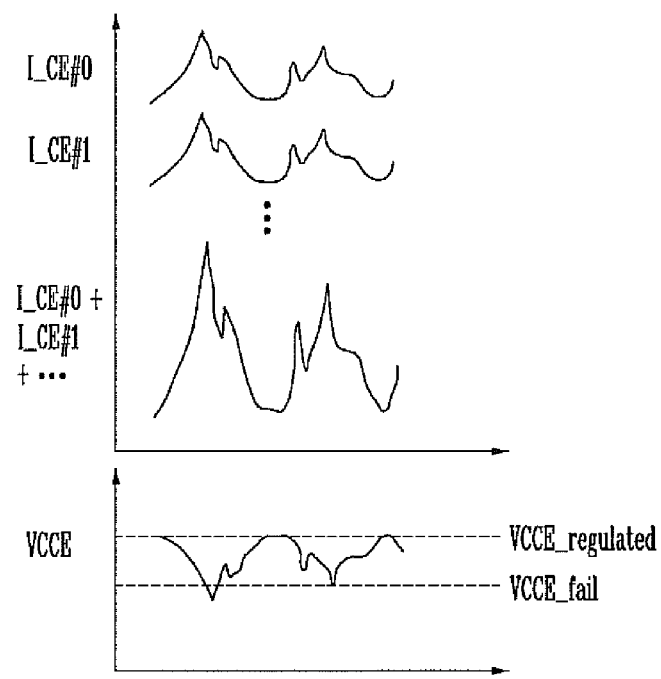
FIG. 2 is a graph illustrating a drop of a power source voltage due to a current overlap in the multi-chip package of FIG. 1.

FIG. 2 is a graph illustrating a drop of a power source voltage due to a current overlap in the multi-chip package of FIG. 1.

Referring to FIG. 2, a total current consumed by the multi-chip package is the sum of currents consumed by all the memory chips sharing a chip enable signal because the memory chips sharing one chip enable signal are coupled in parallel. Accordingly, consumption currents may overlap with each other according to a point of time at which an operation is performed.

An instant peak current may be generated by the current overlap. If the power source voltage VCCE is significantly lowered by the instant peak current, a chip failure may occur. Consequently, an operation for improving the performance of a memory chip, such as chip interleaving, may be limited to prevent the chip failure from the large peak current. A method of preventing a sudden drop of the power source voltage due to a sudden current consumption is described below.

Figure 3:
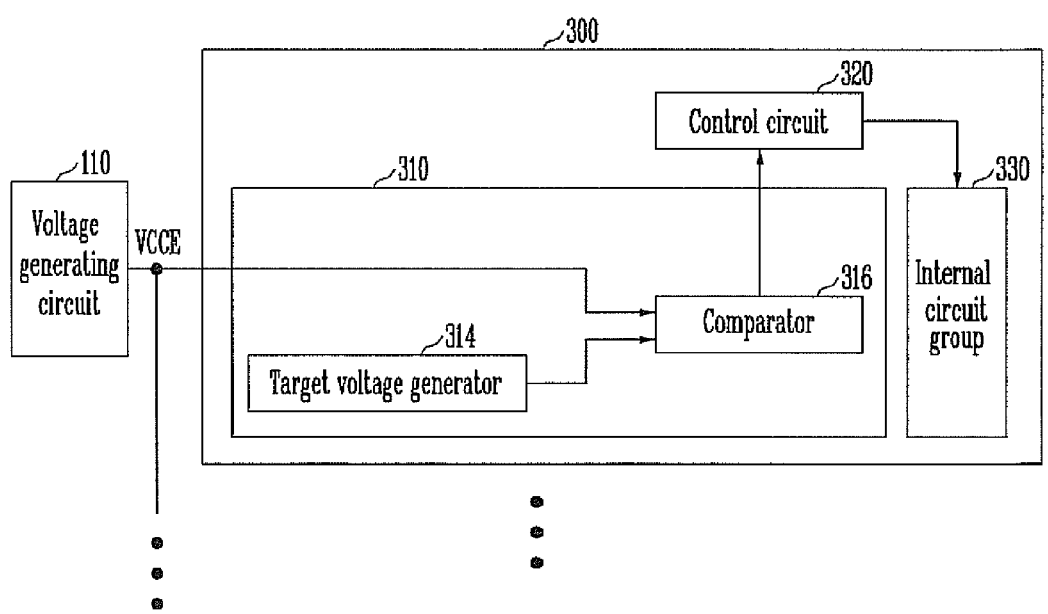
FIG. 3 is a detailed block diagram of a memory chip included in the multi-chip package according to the first embodiment of this disclosure.
Figure 4:
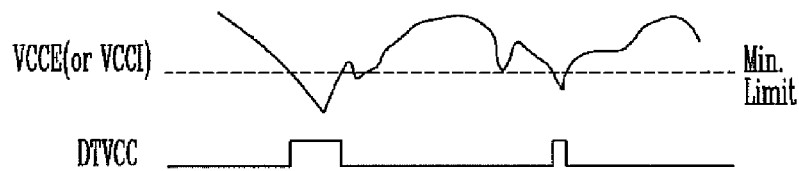
FIG. 4 is a diagram illustrating a sense signal generated by comparing the power source voltage with a target voltage.

FIG. 3 is a detailed block diagram of the memory chip included in the multi-chip package according to the first embodiment of this disclosure, and FIG. 4 is a diagram illustrating a sense signal generated by comparing the power source voltage with a target voltage Min.Limit.

Referring to FIG. 3, the multi-chip package according to the first embodiment includes the voltage generating circuit 110 and a plurality of memory chips 300.

The voltage generating circuit 110 supplies the power source voltage VCCE to the plurality of memory chips 300.

The plurality of memory chips 300 is coupled in parallel to the voltage generating circuit 110 and supplied with the power source voltage VCCE of the voltage generating circuit 110. Each of the memory chips 300 checks the power source voltage VCCE prior to a specific operation incurring high power consumption. If the checked power source voltage is lower than target voltage Min.Limit, the memory chip 300 remains in a standby mode without performing the specific operation until the power source voltage VCCE becomes higher than the target voltage Min.Limit.

The memory chip 300 includes a voltage detecting circuit 310, a control circuit 320, and an internal circuit group 330.

The voltage detecting circuit 310 detects the power source voltage VCCE shared by the memory chips 300. The voltage detecting circuit 310 also compares the power source voltage VCCE with the target voltage Min.Limit. When the power source voltage VCCE is lower than the target voltage Min.Limit, the voltage detecting circuit 310 generates a sense signal DTVCC of a high level. When the power source voltage VCCE is equal to or higher than the target voltage Min.Limit, the voltage detecting circuit 310 generates the sense signal DTVCC of a low level.

Although the power source voltage VCCE has been described, such an external power source voltage VCCE is exemplary only, and a voltage detected by the voltage detecting circuit 310 may be a voltage of the power source voltage VCCE which is regulated within the memory chip or may be an internal voltage VCCI.

The voltage detecting circuit 310 may be driven, in particular, before the memory chip performs an operation incurring high power (or current) consumption.

The voltage detecting circuit 310 includes a target voltage generator 314 and a comparator 316.

The target voltage generator 314 generates the target voltage Min.Limit.

The comparator 316 compares the power source voltage VCCE with the target voltage Min.Limit and outputs the sense signal DTVCC based on a result of the comparison. That is, when the power source voltage VCCE is lower than the target voltage Min.Limit, the comparator 316 generates the sense signal DTVCC of a high level. When the power source voltage VCCE is equal to or higher than the target voltage Min.Limit, the comparator 316 generates the sense signal DTVCC of a low level.

When the sense signal DTVCC of a high level is received from the comparator 316, the control circuit 320 controls the internal circuit group 330 so that the internal circuit group 330 remains in a standby mode without performing a specific operation incurring high power consumption. When the sense signal DTVCC of a low level is received, the control circuit 320 controls the internal circuit group 330 so that the internal circuit group 330 performs the specific operation.

The operation of the control circuit 320 is described in more detail below.

Referring to FIG. 4, it can be seen that the sense signal DTVCC of a high level is outputted when the power source voltage VCCE (or VCCI) is lower than the target voltage Min.Limit, and the sense signal DTVCC of a low level is outputted when the power source voltage VCCE or VCCI is equal to or higher than the target voltage Min.Limit.

The control circuit 320 checks a state of the sense signal DTVCC (that is, whether the sense signal DTVCC is in a high level or a low level) based on a flag signal.

Among the operations of the memory chip, there may be an operation that can be postponed, but there may also be an operation that cannot be postponed. In case of an operation where which can be postponed, the control circuit 320 checks whether the sense signal DTVCC is in a high level or a low level based on the flag signal before performing the operation. In other words, the flag signal is set right before an operation where a point of time at which the operation is performed does not affect operations of the memory cells.

Accordingly, the control circuit 320 checks the flag signal before the operation that can be postponed is performed. If, as a result of the check, the sense signal DTVCC is in a high level, the control circuit 320 controls the internal circuit group 330 so that it does not perform the operation. If, as a result of the check, the sense signal DTVCC is in a low level, the control circuit 320 controls the internal circuit group 330 so that it performs the operation.

Figure 5:
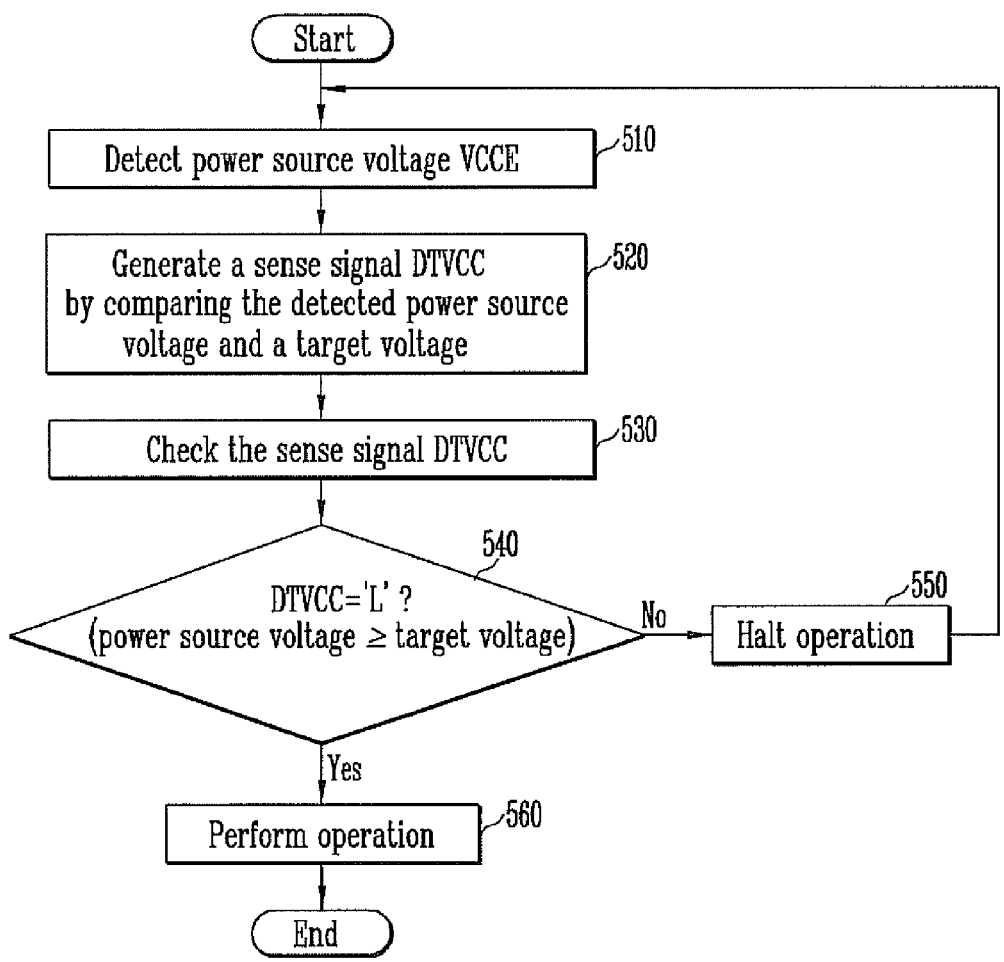
FIG. 5 is a flowchart illustrating the operating method of the multi-chip package according to an embodiment of this disclosure.

FIG. 5 is a flowchart illustrating the operating method of the multi-chip package according to an embodiment of this disclosure.

Referring to FIG. 5, in the operating method of the multi-chip package according to the embodiment of this disclosure, first, the power source voltage VCCE is supplied to the plurality of memory chips. Each memory chip detects the power source voltage VCCE at step 510.

Next, the comparator 316 generates the sense signal DTVCC by comparing the power source voltage VCCE with the target voltage Min.Limit at step 520.

Next, the control circuit 320 checks the sense signal DTVCC at step 530. The sense signal DTVCC is checked before each memory chip performs an operation incurring high current consumption.

If, as a result of the check, the sense signal DTVCC is in a low level, it means that the power source voltage VCCE is equal to or higher than the target voltage Min.Limit. Thus, the operation is performed at step 540 and then terminated.

If, as a result of the check, the checked sense signal DTVCC is in a high level, it means that the power source voltage VCCE is lower than the target voltage Min.Limit, the operation is postponed at step 550. The internal circuit group 330 postpones the intended operation until the power source voltage VCCE becomes equal to or higher than the target voltage Min.Limit.

As described above, a voltage drop check algorithm according to an embodiment of this disclosure is performed before an operation incurring high current is performed. When a voltage drop is detected, the operation is not performed, and when the power source voltage VCCE is at a normal voltage, the operation is performed, Accordingly, a peak current (or peak power) can be reduced, and a sudden drop of the power source voltage VCCE can be prevented.

Figure 6:
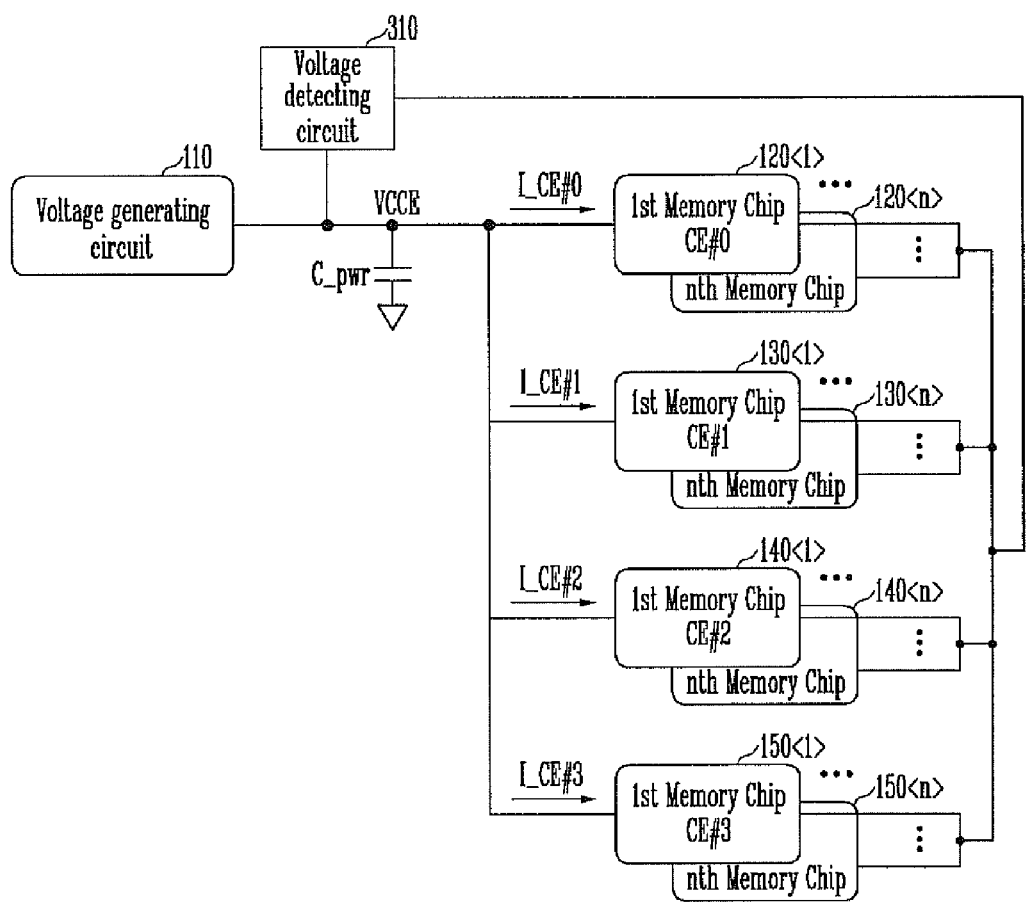
FIG. 6 is a block diagram illustrating a multi-chip package according to a second embodiment of this disclosure.

FIG. 6 is a block diagram illustrating a multi-chip package according to a second embodiment of this disclosure.

Referring to FIG. 6, the multi-chip package according to the second embodiment of this disclosure includes a voltage generating circuit 110, a voltage detecting circuit 310, and a plurality of memory chips 120<1> to 120<n> to 150<1> to 150<n>.

The voltage generating circuit 110 generates the power source voltage VCCE.

The voltage detecting circuit 310 compares the power source voltage VCCE with the target voltage Min.Limit. The voltage detecting circuit 310 generates the sense signal DTVCC when the power source voltage VCCE is lower than the target voltage Min.Limit.

The plurality of memory chips 120<1> to 120<n> to 150<1> to 150<n> is operated by the power source voltage VCCE and is set in a standby mode during the time for which the sense signal DTVCC is received.

In the multi-chip package according to the second embodiment of this disclosure, the voltage detecting circuit 310 is placed outside the memory chips 120<1> to 120<n> to 150<1> to 150<n> and shared by the plurality of memory chips. Accordingly, the multi-chip package according to the second embodiment of this disclosure uses area efficiently because the voltage detecting circuit 310 is not included within each of the memory chips.

Although an example where the voltage detecting circuit 310 is placed outside the memory chips has been described in this embodiment, the control circuit 320 of the first embodiment may also be placed outside the memory chips and shared by the memory chips.

In some embodiments, the functions of the voltage detecting circuit 310 and the control circuit 320 may be implemented within an external controller (not shown). In this case, the external controller controls the operations of all the memory chips. The external controller may halt the execution of an operation incurring high current consumption by detecting the power source voltage VCCE before the operation is performed by a specific memory chip. To this end, the external controller is configured to know what operation is performed by the specific memory chip. Accordingly, the external controller may control the operation of the specific memory chip according to, for example, a protocol standard between the external controller and the specific memory chip.

As described for the previous embodiment, the voltage detecting circuit 310 may include the target voltage generator 314 for generating the target voltage Min.Limit and the comparator 316 for generating the sense signal DTVCC by comparing the power source voltage VCCE with the target voltage Min.Limit.

Figure 7:
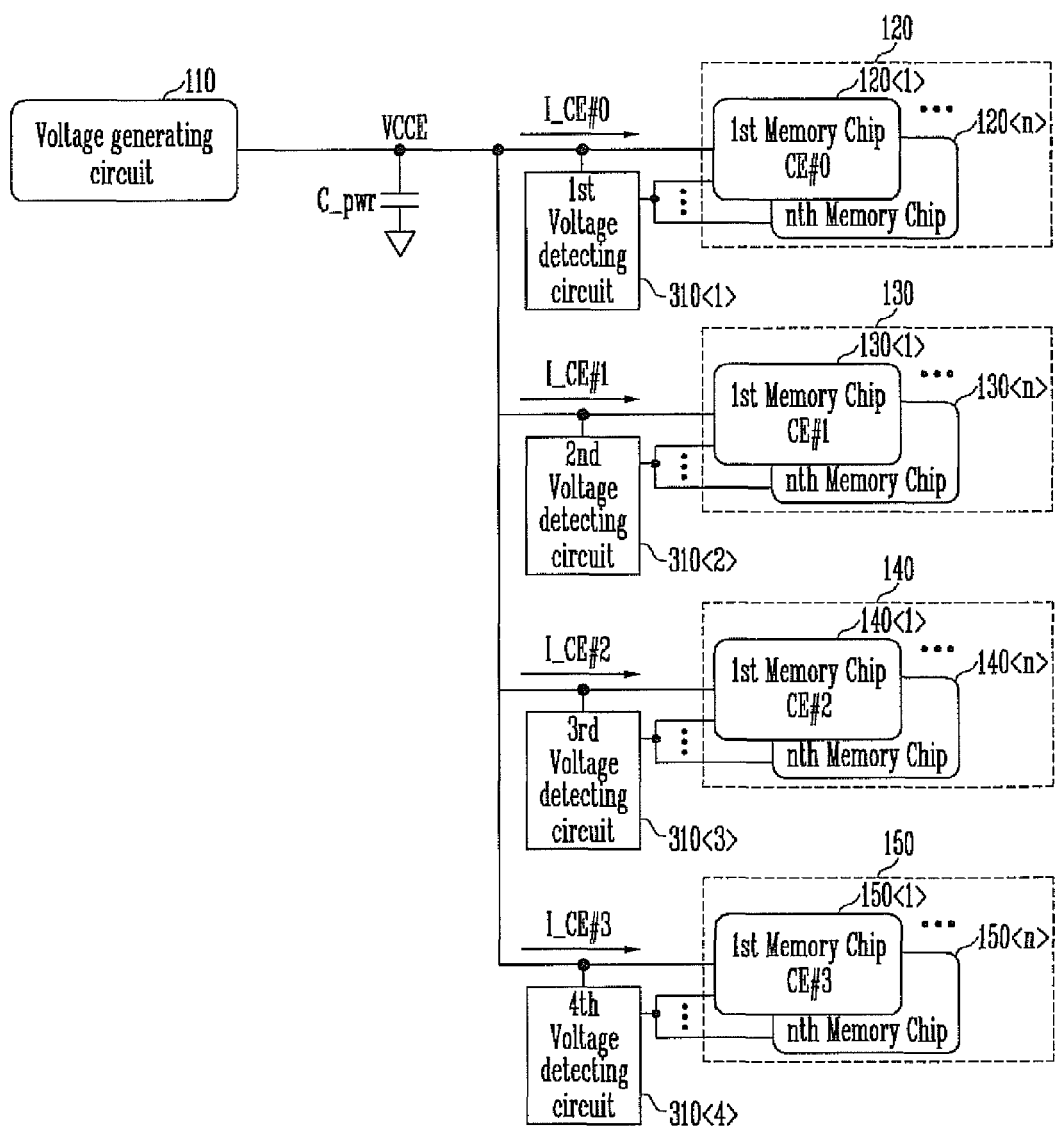
FIG. 7 is a block diagram illustrating of a multi-chip package according to a third embodiment of this disclosure.

FIG. 7 is a block diagram illustrating of a multi-chip package according to a third embodiment of this disclosure.

Referring to FIG. 7, the multi-chip package according to the third embodiment of this disclosure includes a voltage generating circuit 110, a plurality of memory chip groups 120 to 150, and voltage detecting circuits 310<1> to 310<4>.

The voltage generating circuit 110 generates the power source voltage VCCE.

The memory chip groups 120 to 150 includes memory chips 120<1> to 120<n>, 130<1> to 130<n>, 140<1> to 140<n>, and 150<1> to 150<n>, respectively, which are operated by the power source voltage VCCE.

The voltage detecting circuits 310<1> to 310<4> are coupled to the respective memory chip groups 120 to 150. Each of the voltage detecting circuits compares the power source voltage VCCE, supplied to each of the memory chip groups 120 to 150, with the target voltage Min.Limit. If, as a result of the comparison, the power source voltage VCCE is lower than the target voltage Min.Limit, each (for example, 310<1>) of the voltage detecting circuits generates the sense signal DTVCC to the memory chips 120<1> to 150<n> of each (for example, 120) of the memory chip groups.

The memory chips 120<1> to 150<n> is set in a standby mode during the time for which the sense signal DTVCC is received.

In the multi-chip package according to the third embodiment, the voltage detecting circuits 310<1> to 310<4> are coupled to the respective memory chip groups 120 to 150, and the memory chips 120<1> to 120<n>, 130<1> to 130<n>, 140<1> to 140<n>, and 150<1> to 150<n> of the memory chip groups 120 to 150 share the voltage detecting circuits 310<1> to 310<4>, respectively. Thus, the multi-chip package according to the third embodiment uses area efficiently because the voltage detecting circuit 310 is not included in each memory chip.

In the third embodiment, the control circuit 320 of the first embodiment may be placed outside the memory chip groups 120 to 150 and shared by the memory chip groups 120 to 150.

In some embodiments, the functions of the voltage detecting circuit 310 and the control circuit 320 may be implemented within a plurality of external controllers (not shown). In this case, the external controller coupled to the memory chip groups controls the operations of a plurality of memory chips included in each memory chip group. The external controller may halt the execution of an operation incurring high current consumption by detecting the power source voltage VCCE before the operation is performed by a specific memory chip. To this end, the external controller is to know what operation is performed by the specific memory chip. Thus, the external controller may control the operation of the specific memory chip according to, for example, a protocol standard between the external controller and the specific memory chip.

The voltage detecting circuit 310 may include the target voltage generator 314 for generating the target voltage Min.Limit and the comparator 316 for generating the sense signal DTVCC by comparing the power source voltage VCCE with the target voltage Min.Limit.

Figure 8:
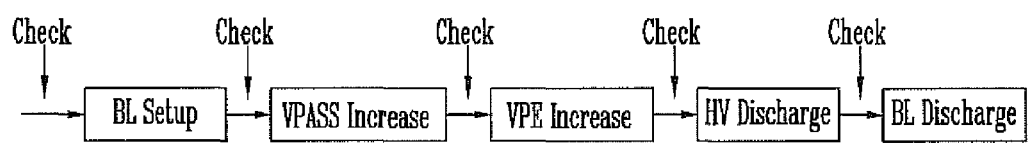
FIG. 8 is a block diagram illustrating that an algorithm used in the operating method of the multi-chip package of FIG. 5 is performed during a program operation.
Figure 9:
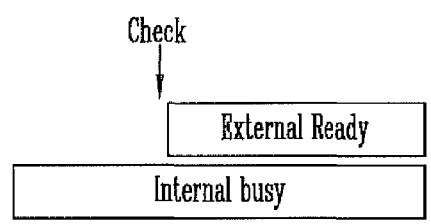
FIG. 9 is a block diagram illustrating that the algorithm used in the operating method of the multi-chip package of FIG. 5 is performed during a cache operation.

FIG. 8 is a block diagram illustrating that the drop check algorithm used in the operating method of the multi-chip package in FIG. 5 is performed during a program operation, and FIG. 9 is a block diagram illustrating that the drop check algorithm used in the operating method of the multi-chip package in FIG. 5 is performed during a cache operation.

As described above, the drop check algorithm checks a voltage drop before an operation incurring high current consumption is performed.

The voltage drop check may be performed in a period where consumed current is 25 mA or higher.

Referring to FIG. 8, in case of a program operation, current consumption is high in a bit line setup period BL Setup, a pass voltage increase period VPASS Increase, a program/erase voltage increase period VPE Increase, a high voltage discharge period HV Discharge, and a bit line discharge period BL Discharge. The sense signal DTVCC is checked to detect a voltage drop before the above-described periods.

Referring to FIG. 9, in case of a cache operation, current consumption is high when an external ready state is entered. Thus, the sense signal DTVCC is checked to detect a voltage drop before the external ready state is entered.

A large current is consumed by a bit line precharge operation, in addition to the program operation or the cache operation described with reference to FIGS. 8 and 9.

The device may malfunction due to a voltage drop within the package because a large amount of current is consumed by the bit line precharge operation. As an alternative, a method of dividing bit lines into several groups and sequentially precharging the bit lines at specific time intervals may be used. In this case, an excessive drop of the power source voltage VCCE may be prevented by decreasing consumption current according to a current distribution scheme.

In addition to the method, the power source voltage VCCE may be checked using the voltage drop check algorithm of the present embodiment before the bit line precharge operation is performed. In this case, since the bit line precharge operation is performed after the power source voltage VCCE becomes normal, current consumption can be reduced, and an excessive drop of the power source voltage VCCE can be prevented.

As described above, the embodiments of this disclosure reduce a peak current or a peak power.

A peak power of the entire package is reduced by automatically halting an operation consuming a large current in a period where may operations overlap. Accordingly, chip interleaving and a cache operation can be performed without a chip failure due to voltage drop even in a stacked multi-chip package.

Accordingly, the present disclosure may be applied to all semiconductor memory devices performing an operation of consuming a large amount of current at once as in a bit line precharge operation.

What is claimed is:

1. A multi-chip package, comprising:
a voltage generating circuit configured to generate a power source voltage; and
a plurality of memory chips coupled to the voltage generating circuit in parallel to each receive the power source voltage, wherein the memory chips are each configured to check the power source voltage before performing a preset operation in which the amount of current consumption is greater than a given value, postpone the preset operation if the power source voltage is lower than a target voltage and perform the preset operation when the power source voltage reaches the target voltage.

2. The multi-chip package of claim 1, wherein each of the memory chips comprises:
a voltage detecting circuit configured to detect the power source voltage, compare the detected power source voltage with the target voltage, and generate a sense signal if, as a result of the comparison, the power source voltage is lower than the target voltage; and
a control circuit configured to control an internal circuit so that the internal circuit maintains a standby mode in response to the sense signal.

3. The multi-chip package of claim 2, wherein the voltage detecting circuit comprises:
a target voltage generator configured to generate the target voltage; and
a comparator configured to generate the sense signal by comparing the power source voltage with the target voltage.

4. The multi-chip package of claim 2, wherein the control circuit is configured to set a check signal before the memory chip performs the preset operation and check the sense signal in response to the check signal.

5. The multi-chip package of claim 2, wherein
the voltage detecting circuit is configured to generate the sense signal of a high level if, as a result of the comparison, the power source voltage is lower than the target voltage and generate the sense signal of a low level if, as a result of the comparison, the power source voltage reaches the target voltage.

6. The multi-chip package of claim 5, wherein
the control circuit is configured to control the internal circuit so that the internal circuit maintains the standby mode when the sense signal of the high level is received and performs the preset operation when the sense signal of the low level is received.

7. The multi-chip package of claim 1, wherein the preset operation comprises a bit line precharge operation.

8. A multi-chip package, comprising:
a voltage generating circuit configured to generate a power source voltage;
a voltage detecting circuit configured to compare the power source voltage with a target voltage and generate a sense signal if, as a result of the comparison, the power source voltage is lower than the target voltage before performing a preset operation in which the amount of current consumption is greater than a given value; and
a plurality of memory chips configured to each receive the power source voltage and maintain a standby mode when the sense signal is received.

9. The multi-chip package of claim 8, wherein the voltage detecting circuit comprises:
a target voltage generator configured to generate the target voltage; and
a comparator configured to generate the sense signal by comparing the power source voltage with the target voltage.

10. The multi-chip package of claim 8, wherein
each of the memory chips comprises a control circuit configured to control an internal circuit so that the internal circuit maintains the standby mode in response to the sense signal, and
the control circuit is configured to set a check signal before the memory chip performs the preset operation and check the sense signal in response to the check signal.

11. A multi-chip package, comprising:
a voltage generating circuit configured to generate a power source voltage;
a plurality of memory chip groups each comprising memory chips operated by the power source voltage; and
voltage detecting circuits corresponding to the plurality of memory chip groups, respectively, wherein the voltage detecting circuits are each configured to compare the power source voltage with a target voltage and to output a sense signal to the memory chips of the memory chip group if, as a result of the comparison, the power source voltage is lower than the target voltage before performing a preset operation in which the amount of current consumption is greater than a given value,
wherein the memory chips of the memory chip group are each configured to maintain a standby mode when the sense signal is received.

12. The multi-chip package of claim 11, wherein each of the voltage detecting circuits comprises:
   a target voltage generator configured to generate the target voltage; and
   a comparator configured to generate the sense signal by comparing the power source voltage with the target voltage.

13. The multi-chip package of claim 11, wherein:
   each of the memory chips comprises a control circuit configured to control an internal circuit so that the internal circuit maintains the standby mode in response to the sense signal and set a check signal before the memory chip performs the preset operation and check the sense signal in response to the check signal.

14. An operating method of a multi-chip package, comprising:
   supplying a power source voltage to a plurality of memory chips;
   checking the power source voltage before a preset operation in which the amount of current consumption is greater than a given value is performed by a memory chip of the memory chips;
   maintaining the memory chip in a standby mode if, as a result of the check, the power source voltage is lower than a target voltage; and
   allowing the memory chip to perform the preset operation if, as a result of the cheek, the power source voltage has reached the target voltage.

15. The operating method of claim 14, wherein checking the power source voltage comprises:
   detecting the power source voltage and generating a sense signal by comparing the detected power source voltage with the target voltage; and
   checking the sense signal.

16. The operating method of claim 14, wherein the preset operation comprises a bit line precharge operation.

* * * * *